United States Patent [19]
Kaufman

[11] 3,958,075
[45] May 18, 1976

[54] HIGH POWER THICK FILM CIRCUIT WITH OVERLAPPING LEAD FRAME

[75] Inventor: Lance R. Kaufman, Milwaukee, Wis.

[73] Assignee: Gentron Corporation, Milwaukee, Wis.

[22] Filed: Nov. 11, 1974

[21] Appl. No.: 522,564

[52] U.S. Cl. .............................. 174/16 HS; 29/626; 29/577; 174/52 FP; 317/101 CC; 357/70; 357/80; 357/81
[51] Int. Cl.² ............................................ H01B 7/34
[58] Field of Search ............ 29/625, 626, 628, 620, 29/621, 577, 589, 471.1, 471.3, 472.1, 484, 493, 497, 500, 502, 503; 174/68 S, 16 HS, DIG. 3, 52 FP; 317/101 A, 101 B, 101 C, 101 CC, 101 CE; 339/17 R, 17 B, 17 C, 17 CF, 17 L, 17 LC, 17 N; 357/70, 76, 80, 81, 77, 69, 65

[56] References Cited
UNITED STATES PATENTS

| | | | |
|---|---|---|---|
| 3,839,660 | 10/1974 | Stryker | 357/81 X |
| 3,881,245 | 5/1975 | Dudley et al. | 317/101 CC X |
| 3,885,304 | 5/1975 | Kaiser et al. | 357/80 X |

Primary Examiner—Victor A. Di Palma
Attorney, Agent, or Firm—Arthur L. Morsell, Jr.

[57] ABSTRACT

The lead frame for a thick film circuit has inwardly extending strip portions of substantial area which are positioned and dimensioned to substantially match and overlie selected thick film conductors to increase the current carrying capacity thereof and to act as mounting elements and heat diffusers for diodes, SCRs (silicon controlled rectifiers) and other heat-generating components.

2 Claims, 5 Drawing Figures

U.S. Patent  May 18, 1976  3,958,075
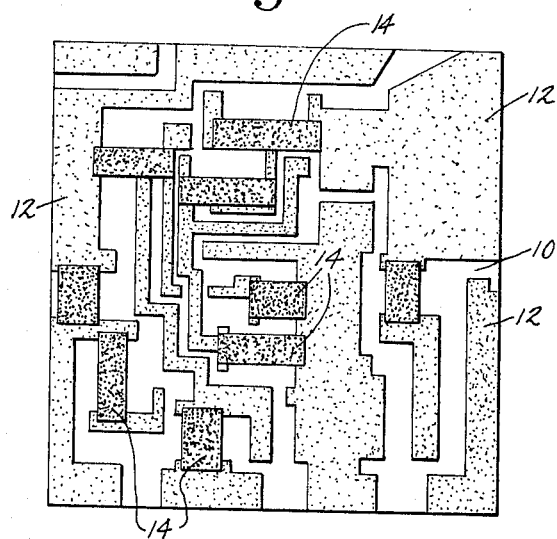
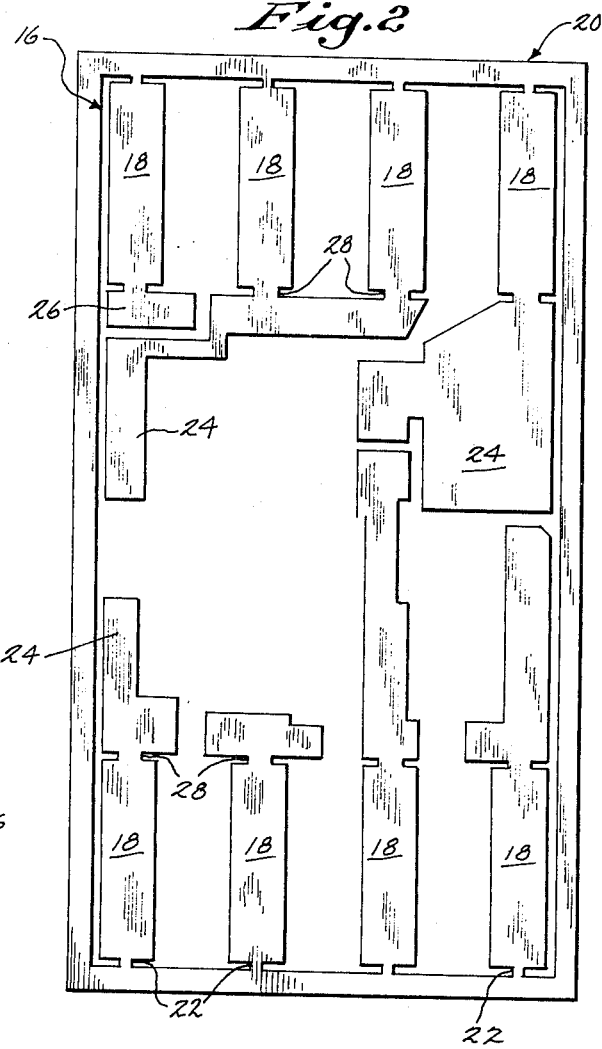
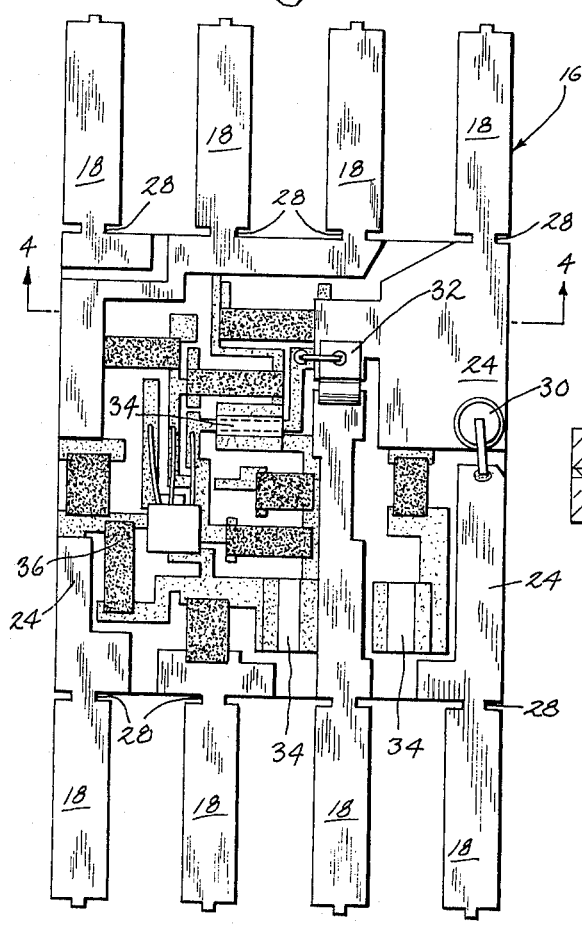
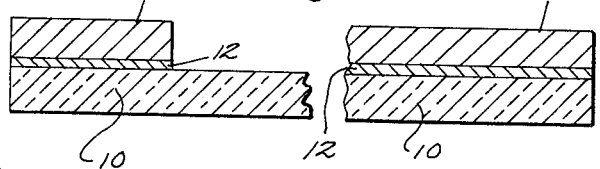
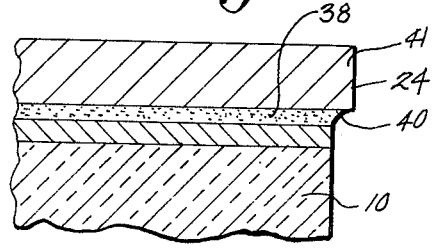

HIGH POWER THICK FILM CIRCUIT WITH OVERLAPPING LEAD FRAME

BACKGROUND OF THE INVENTION

This invention relates to thick film circuits in which thick film conductors and resistance elements are deposited on a flat base plate of insulating material and in which a lead frame having a plurality of leads has, in the past, been soldered to minor peripheral portions of the thick film conductors to provide external circuit connections therefor. In the past, the current carrying capacity of such circuits was limited to a relatively low value due to the relatively low current carrying capacity of the thick film conductors. Currents in excess of the capacity of the particular conductor will cause the thick film conductors to open due to melting and/or vaporization of the conducting film, thus interrupting current flow therethrough.

SUMMARY OF THE INVENTION

The principal object of this invention is to provide a way of increasing the current carrying capacity of thick film circuits and of decreasing thermal resistance between the heat-generating components and the back side of the ceramic mounting plate. In accordance with this invention, the current carrying capacity of selected thick film conductors is increased by providing inwardly extending strip portions of the lead frame which are positioned and dimensioned to substantially match and overlie the selected thick film conductors and which are soldered or bonded thereover. The inwardly extending strip portions of the lead frame not only support the leads but also act as mounting elements and heat diffusers for heat-generating components such as diodes, SCRs, and the like. The inwardly extending strip portions of the lead frame are preferably positioned and dimensioned to accurately match with the thick film conductors that they overlie so that, during assembly, when solder is being used, surface tension in the molten solder which is deposited between the conductors and the overlying strip portions of the lead frame will tend to move the margins of the lead frame into matching alignment with the thick film conductors.

DESCRIPTION OF THE DRAWINGS

FIG. 1 is a plan view of an insulating plate having thick film conductors and resistors deposited thereon.

FIG. 2 is a plan view of a lead frame which has been cut from a sheet and which has inwardly extending portions which are arranged and dimensioned to overlie selected thick film conductors in FIG. 1 when assembled thereon.

FIG. 3 is a plan view of the leads of FIG. 2 showing the inwardly extending strip portions thereof soldered over the thick film circuit conductors of FIG. 1, and showing circuit components connected between selected thick film conductors and between selected inwardly extending portions of the leads.

FIG. 4 is an enlarged cross sectional view taken on the line 4—4 of FIG. 3, part being broken away.

FIG. 5 is an enlarged cross-sectional view showing how surface tension in the molten solder film tends to cause registration of the inwardly extending strip portions with the thick film conductors that they overlie when a soldering method is used.

DESCRIPTION OF THE PREFERRED EMBODIMENT

FIG. 1 is a plan view of a flat plate of insulating material 10 which has a predetermined pattern of thick film conductors 12 and resistors 14 deposited thereon by conventional techniques to form the base for a particular electrical circuit, e.g. a motor control circuit, control rectifier assembly circuit, battery charger, or the like. To provide external leads for the circuit, lead frame 16 (FIG. 2) is stamped or etched out of a flat sheet of copper or other electrically conductive metal and includes a plurality of leads 18 which are arranged and dimensioned to align, in assembly, with selected peripheral portions of thick film conductors 12 and extend outwardly therefrom. A temporary peripheral holding frame 20 which surrounds and interconnects with leads 18 at narrow necks 22 maintains the parts in proper relationship prior to assembly. The structure of FIG. 2 includes relatively wide inwardly extending strip portions 24 which are dimensioned and arranged to match, in assembly, selected thick film conductors 12 to increase the current carrying capacity thereof and lateral heat diffusion characteristics. Lead frame 16 is relatively thick compared to thick film conductors 12 and has a correspondingly larger current carrying capacity. As a typical example, the lead frame may be 0.020 of an inch and the thick film conductors 0.001 of an inch thick. Inwardly extending portions 24 are of substantially greater area than the small peripheral portion 26 (FIG. 2) which is typical of the small connections between a lead frame and the conductors as heretofore employed for all connections.

In accordance with this invention, inwardly extending portions 24 of relatively large area are employed for the purpose of increasing the current carrying capacity of the thick film conductors 12 that they are adapted to overlie in laminated relationship. No extra effort is required to form inwardly extending portions 24, since they are stamped out or etched in the same operation that forms leads 18, and are an integral part of lead frame 16. The soldering in place of the portions 24 simultaneously accomplishes the connection of the majority of the leads 18 in the assembly of FIG. 3.

In this particular lead frame 16, leads 18 are notched at 28 to permit them to be easily bent at right angles to plate 10 at the edges thereof. This is due to the fact that leads 18 are directed at right angles to plate 10 in the final package for this particular embodiment. However, notches 28 are not an essential feature of the invention and may be omitted in other embodiments in which leads 18 extend in the same plane as the plate 10 in the final package.

To form the circuit, lead frame 16, which is held together by temporary frame 20, is superimposed over base plate 10 with parts 24 arranged to register with and be electrically coupled with conductor portions 12, there being solder, solder paste which is later reflowed, or conductive adhesive, such as a conductive epoxy or thermo-compression bonding. In the claims the term "bonding" comprehends any of these procedures. Also, preferably in the same operation, the required separate components such as a diode 30 (FIG. 3), SCR 32, capacitors 34, and transistor 36 are similarly connected to the appropriate inwardly extending portions 24 and to thick film conductors 12. Then temporary holding frame 20 is severed from leads 18 at necks 22 by breaking or cutting. When solder paste is used all solder connections are reflowed simultaneously. Although an important purpose of the inwardly extending strip portions 24 is to increase the current carrying capacity of the thick film conductors 12 that they match and overlie in laminated relationship, they also simultaneously provide the connection between the leads and the conductors. Inwardly extending portions 24 also act as mounting elements and lateral heat diffusers for diode 30, SCR 32, or any other heat-generating component that may be connected in the circuit.

The thermal resistance from the lower side of any heat-generating component to the opposite side of the ceramic plate 10 is reduced by the use of the present invention. In a case where the heat-generating components such as 30 and 32 are mounted on lead frame 24, which has a low thermal resistance, the heat diffuses in a direction parallel to the face of plate 10 and simultaneously diffuses through 10, due to the relatively large area of portions 24. Thus heat diffusion through the ceramic plate 10 occurs over an area of significantly greater size than the size of heat-generating components such as 32 and 30.

Inwardly extending portions 24 are preferably arranged and dimensioned to accurately register with the thick film conductors 12 that they overlie to match the outlines thereof. When solder is being used and where the outlines match as in the illustrated example, the surface tension in the film of molten solder 38 (FIG. 5) between inwardly extending lead portions 24 and thick film conductors 12 tends to draw the margins of portions 24 into matching registration with the margins of conductors 12 due to the tendency of the molten solder surface 40 to shrink as much as possible. Thus, any small misalignments between the margins of portions 24 and the margins of thick film conductors 12, such as shown at 41 in FIG. 5, will be automatically eliminated by the above-noted self-aligning feature which is shown in somewhat exaggerated form in FIG. 5. While accurate alignment of marginal edges of the strip portions 24 with the conductors 12 is highly desirable, it is not essential in all uses of the invention.

After the bonding operation described above has been performed, the circuit can be molded or potted and mounted on a heat sink, if necessary, or can be soldered in place within a larger circuit, or otherwise processed to prepare it for sale and use.

Various changes and modifications may be made without departing from the spirit of the invention, and all of such changes are contemplated as may come within the scope of the claims.

What I claim is:

1. In a thick film electrical circuit including an insulating face plate and thick film conductors adhering to one surface of said face plate, the improvement wherein there are electrically conductive external leads which are of substantially greater thickness than the thick film conductors and which have integral inwardly extending strip portions of said greater thickness and of low thermal resistance, some of said strip portions overlying selected thick film conductors in electrical contact therewith and in laminated relationship to substantially increase the current carrying capacity thereof, and at least one heat generating semi-conductor component mounted directly on an inwardly extending strip portion from said external leads whereby one contact of said semi-conductor component is electrically connected to said strip portion by said mounting, said last mentioned strip portion being of greater area than other strip portions and of greater area than said semi-conductor component thereon, and the laminated relationship of said last mentioned strip portion on the thick film conductor portion therebelow providing for lateral thermal heat diffusion from said component into said strip portion whereby heat diffusion through the insulating face plate occurs over a substantially greater area than the area occupied by the heat generating component, and means electrically connecting another contact of said semi-conductor to another strip portion.

2. A thick film electrical circuit as claimed in claim 1 in which at least some of the inwardly extending strip portions have outlines which substantially match the outlines of thick film conductor portions which they overlie.

* * * * *